United States Patent [19]

Chinone et al.

[11] Patent Number: 4,881,235
[45] Date of Patent: Nov. 14, 1989

[54] SEMICONDUCTOR LASER HAVING A MULTIPLE QUANTUM WELL STRUCTURE DOPED WITH IMPURITIES

[75] Inventors: Naoki Chinone; Kazuhisa Uomi, both of Hachioji; Tadashi Fukuzawa, Tokyo; Hideaki Matsueda, Tokorozawa; Takashi Kajimura, Tokyo; Tsukuru Ohtoshi, Kokubunji, all of Japan

[73] Assignee: Hitachi, Ltd., Tokyo, Japan

[21] Appl. No.: 41,410

[22] Filed: Apr. 23, 1987

Related U.S. Application Data

[63] Continuation-in-part of Ser. No. 888,073, Jul. 22, 1986.

[30] Foreign Application Priority Data

Jul. 26, 1985 [JP] Japan .............................. 60-164002
Sep. 13, 1985 [JP] Japan .............................. 60-201543
Apr. 23, 1986 [JP] Japan .............................. 61-92093

[51] Int. Cl.[4] .............................................. H01S 3/19
[52] U.S. Cl. .......................................... 372/45; 372/46; 372/704
[58] Field of Search ....................... 372/44, 45, 46, 26

[56] References Cited

U.S. PATENT DOCUMENTS

| | | | |
|---|---|---|---|
| 4,132,960 | 1/1979 | Streifer et al. | 372/45 |
| 4,512,022 | 4/1985 | Tsang | 372/45 |
| 4,573,161 | 2/1986 | Sakai et al. | 357/17 X |
| 4,599,728 | 7/1986 | Alavi et al. | 372/45 |
| 4,644,378 | 2/1987 | Williams | 357/17 |
| 4,644,553 | 2/1987 | Van Ruyuen et al. | 372/45 |
| 4,701,774 | 10/1987 | McIlroy et al. | 357/17 |
| 4,706,253 | 11/1987 | Su et al. | 372/44 |

Primary Examiner—James W. Davie
Attorney, Agent, or Firm—Antonelli, Terry & Wands

[57] ABSTRACT

In a well-known semiconductor laser, a multiple quantum well type active layer consisting of barrier layers and active layers or well layers, each of which has a thickness less than the de Broglie wavelength of electrons, is doped with an impurity, and the impurity density is made higher in the barrier layer than in the well layer. Further, in a case where the multiple quantum well active layer is held between p-type and n-type cladding layers, the well layer is undoped, the part of the barrier layer lying in contact with the well layer is undoped, and the other part of the barrier layer close to the p-type cladding layer is put into the n-conductivity type while that of the barrier layer close to the n-type cladding layer is put into the n-conductivity type. Desirably, the impurity density should range from about $1 \times 10^{18}$ to about $1 \times 10^{19}$ cm$^{-3}$.

40 Claims, 9 Drawing Sheets

SEMICONDUCTOR LASER HAVING A MULTIPLE QUANTUM WELL STRUCTURE DOPED WITH IMPURITIES

This application is a continuation-in-part application of U.S. application Ser. No. 06/888,073, filed July 22, 1986.

BACKGROUND OF THE INVENTION

The present invention relates to semiconductor lasers, and more particularly to the structure of a semiconductor laser featuring a high modulation speed and a low threshold current.

The invention further relates to quantum well-type semiconductor lasers which oscillate on a small threshold current that was not realized so far, and particularly to semiconductor lasers adapted to opto-electric integrated circuits or to optical integrated circuits.

The modulation speed of a semiconductor laser is proportional to the maximum frequency of the modulation of the semiconductor laser. In order to raise the speed of a semiconductor laser, accordingly, the maximum frequency in the direct modulation of the semiconductor laser needs to be rendered as high as possible. Usually, the maximum frequencies in the direct modulation of semiconductor lasers are approximately 5 GHz. Recently, it has been theoretically predicted that the maximum frequency will rise with the so-called quantum well type laser in which the thickness of an active layer is smaller than an electron wave packet within a crystal (Y. ARAKAWA et al.: Applied Physics Letters, 45, 950 (1984)). On the other hand, it has been experimentally verified as to conventional semiconductor lasers that the maximum frequency rises when an active layer is heavily doped with an impurity (C. B. SU et al.: Applied Physics Letters, 46, 344 (1985)). In either case, however, the maximum frequency of the direct modulation is near 10 GHz without any other special contrivance.

In the Record of the 9th Laser Conference, pp. 162-3, it has been disclosed by C. B. SU et al. that the modulatible frequency of a semiconductor laser increases when the impurity concentration of a p-type active layer is raised. This is based on the fact that the increment of a gain coefficient versus the increase of injected carriers is enlarged by impurity doping. This method, however, has had the problem that the lifetimes of the carriers of the active layer shorten to raise the threshold current and to lower the radiation efficiency.

Furthermore, it has been urged to provide a semiconductor laser which oscillates on a small threshold current, i.e., to provide a semiconductor laser which consumes electric power in small amounts as a source of light for optoelectric integrated circuits (OEIC's) or for optical integrated circuits (OIC's). A method to decrease the threshold current by employing an active layer of the quantum well type and utilizing the quantum size effect, has been announced by Sugimoto et al., in Tsushingihoto, published by the Japanese Association of Electronic Communications, Vol. OQE 85-78, p. 85. According to this method, the threshold current is about 8 mA, which is about one-half the threshold current of 20 mA of the conventional semiconductor laser of the double heterostructure.

According to the above-mentioned conventional art, the device structure of the quantum well active layer has been almost optimized. With the conventional quantum well active layer, therefore, it is difficult to decrease the threshold current to be smaller than the above-mentioned value (about 8 mA). However, the threshold current of this level is too great for the source of light for OEIC's, and must further be decreased to realize OEIC's having many functions and in a highly integrated form.

SUMMARY OF THE INVENTION

The present invention has been made in order to eliminate the disadvantages of the prior art, and has for its object to provide a semiconductor laser exhibiting a low threshold current as well as a high radiation efficiency, and which is capable of direct modulation at or above 10 GHz.

The maximum frequency of the direct modulation of a semiconductor laser is substantially determined by a relaxation oscillation frequency $f_r$. The relaxation oscillation frequency $f_r$ originates from a phase shift in the variations of light and electrons. As a method effective for raising the frequency $f_r$, it is considered to increase the ratio ($\Delta g/\Delta n$) of the increment $\Delta g$ of a gain to the increment $\Delta n$ of a carrier density, that is, a differential gain. It is reported in the Y. ARAKAWA et al. literature mentioned above that the differential gain enlarges with the so-called quantum well type laser in which the thickness of the active layer of the semiconductor laser is reduced so as to be smaller than the wave packet of free electrons within a crystal. On the other hand, it is reported by C. B. SU et al. as stated above that the frequency $f_r$ increases when the active layer of the conventional semiconductor laser is doped with an impurity at a high concentration. This is also considered to be based on the increase of the differential gain by the high concentration of impurity.

The inventors have found out that, in order to increase the speed of modulation by further raising the frequency $f_r$ of the laser such as the quantum well type laser in which the thickness of the active layer is smaller than the wave packet of the free electrons within the crystal, an impurity may be introduced into the active layer which has hitherto been undoped or into two or more active layers as included in the quantum well type laser or a barrier layer located between these active layers, and that, as regards the concentration of the impurity, the impurity needs to be introduced at a concentration higher than the density of carriers which are injected into the active layer in a lasing mode. In this connection, it has been revealed that, when a donor is introduced as the type of the impurity, the two-dimensionality of the electrons is prone to deteriorate to lessen the differential gain, so an acceptor is more effective. Besides, in the multiple quantum well type laser in which the plurality of thin active layers are disposed with the barrier layers interposed therebetween, carriers generated by the impurity with which the barrier layers are doped are trapped by the active layers. It has been revealed that, in this case, a band tail formed by the impurity doping does not deteriorate the two-dimensionality of the electrons or holes and does not lower the differential gain, so the speed of modulation can be increased. That is, in a semiconductor laser wherein the thickness of an active layer is smaller than the wave packet of free electrons within a crystal, a semiconductor laser according to the present invention consists in that the active layer or a barrier layer, the band gap of which is greater than those of at least two active layers included, is doped with an impurity at a density higher than the density of carriers which are injected into the active layer, whereby the relaxation oscillation frequency $f_r$ of the quantum well type laser is raised to heighten the maximum frequency and to increase the speed of modulation.

One of the methods of reducing the threshold current of a semiconductor laser is to put the active layer thereof into a multiple quantum well structure. This is based on the fact that the proportion of carriers contributive to a gain increases owing to a stepped state density caused by the two-dimensionality of carriers. Further, it is generally known that, in the multiple quantum well structure, the increment of the gain versus the increases of injected carriers becomes greater than in a conventional double heterostructure. By doping the multiple quantum well active layer of the multiple quantum well type semiconductor laser into the p-type or n-type, it can be expected that high-speed modulation characteristics will be sharply improved. However, when the doping is performed for the entire multiple quantum well structure, it is feared that an active layer where carriers are locally existent will undergo band tailing, by which the two-dimensionality of the carriers will be deteriorated. The inventors have accordingly found out that, when the active layer where the carriers exist is not doped but only a barrier layer is selectively doped, the two-dimensionality of the carriers is not deteriorated, so the high-speed modulation characteristics can be improved (FIG. 4). In the multiple quantum well structure, however, the wave function of electrons or holes penetrates to the barrier layer. The inventors have therefore invented a structure in which, in the barrier layer, several atomic layers lying in contact with the active layer are left undoped, while the central region of the barrier layer is of the p-type or n-type (FIG. 5). Further, it has been found out that, when the central regions of the barrier layers are selectively doped, they are put into the n-type on the side of a p-type cladding layer and into the p-type on the side of an n-type cladding layer as illustrated in FIG. 6. Thus, the active layer is doped in both the p- and n-types, the increment of the gain versus the injected carriers enlarges greatly, and sharp improvements in the high-speed modulation can be expected.

In brief, in a semiconductor laser wherein a semiconductor substrate is formed thereon with at least a cladding layer and an active layer or with at least a multiple quantum active active region in which well layers and barrier layers are alternately stacked and p-type and n-type cladding layers each of which has a band gap greater than that of the active layer, a thickness of the active layer being less than the de Broglie wavelength of electrons; the conductivity types of the constituent semiconductor layers are made spatially different in the stacking direction thereof, whereby a semiconductor laser of high modulation speed has been obtained.

As described above, a semiconductor laser according to the present invention consists, in a semiconductor laser wherein the thickness of an active layer is smaller than the wave packet of free electrons within a crystal, in that the active layer mentioned above or a barrier layer whose band gap is greater than the thickness of an active layer in the presence of at least two active layers is doped with an impurity at a density higher than the density of carriers which are injected into the active layer, whereby the relaxation oscillation frequency $f_r$ of the quantum well type laser is raised to permit direct modulation at the maximum frequency of or above 20 GHz, far exceeding 10 GHz, and to achieve a sharp enhancement in the modulation speed of the semiconductor laser. A further effect is that the semiconductor laser is applicable as a light source for an optical arithmetic circuit or for ultrahigh-speed optical communications.

The object of the present invention is to provide a semiconductor laser which operates on a small threshold current (smaller than 3 mA) that could not be realized so far, and to provide a source of light for OEIC's having high performance and large-scale integration.

In order to obtain a semiconductor laser which oscillates on a small threshold current that could not be realized thus far, the inventors of the present invention have furthered the study in connection with a semiconductor laser having an active layer of the carrier injection type semiconductor laser as a quantum well structure, and have attempted to dope the whole or part of the quantum well active layer with impurities of a high density (greater than $10^{18}$ cm$^{-3}$) to artificially control the electron density and the hole density, so that electrons or holes (or both of them) are made present in the quantum well active layer when the carriers are not injected (when no bias is applied), and have thus discovered that the threshold current can be decreased. The quantum well active layer may be of the multiple quantum well structure in which well layers and barrier layers are alternatingly superposed one upon another, or may be of the GRIN-SCH (graded-index-separate-confinement-heterostructure) type in which the mol ratio of aluminum gradually changes in the barrier layer.

The inventors have prepared a developed gain spectrum analysis model of the quantum well active layer doped with impurities, and have adapted the model to the multiplex quantum well structure. FIG. 2 shows the calculated results. In this calculation, the aluminum mole ratio ($X_W$) in the well layer was selected to be 0, the aluminum mole ratio ($X_B$) in the barrier layer was selected to be 0.2, and the thickness of the well layer was selected to be 5 nm. It was clarified that the carrier density necessary for oscillation decreased with the increase in the doping density, and the threshold current decreased both in the cases of p-type doping and n-type doping. In particular, it was clarified that the carrier density decreased to about one-half that of the undoped multiple quantum well structure when the doping was effected at a density of greater than $2 \times 10^{18}$ cm$^{-3}$ in the case of the n-type doping and when the doping was effected at a density of greater than $4 \times 10^{18}$ cm$^{-3}$ in the case of the p-type doping; i.e., the carrier density could be decreased to smaller than one-fourth that of the conventional double hetero structure. When the doping density was increased to be greater than $1 \times 10^{19}$ cm$^{-3}$, however, the crystallinity decreased abruptly. It was therefore learned that the upper limit of the doping density was $1 \times 10^{19}$ cm$^{-3}$. In this case, the carrier density decreases to about 1/20 in the case of the n-type doping and decreases to 1/6 in the case of the p-type doping compared with that of the conventional double hetero structure. It was also found that magnesium, beryllium, silicon or selenium ions with small diffusion coefficient in solid could be effectively used as impurities.

If the quantum well active layer is doped with impurities to a large concentration, the threshold current decreases because of the reasons described below. Namely, being doped highly with impurities, there exist many quantized carriers in the well layer even under the non-biased condition, i.e., even when no carrier is injected. If consideration is given to the case of the p-type doping, the quantum level in the valence band is occupied by positive holes emitted from the acceptor. The gain contribution to laser oscillation is obtained by subtracting therefrom the net absorption of light. Therefore, if there exist quantized positive holes in the valence band as described above, the net absorption of light decreases. Accordingly, oscillation takes place at a small density of electron injection. The same also holds true even in case of the n-type doping.

According to the present invention in which impurities are to a high introduced density into the whole or part of the quantum well active layer as described above, there is obtained a semiconductor laser element that operates on a threshold current that is far smaller than the threshold current of the conventional semiconductor lasers. Therefore, there is obtained a highly reliable laser element which can be effectively used as a source of light for the opto-electric integrated circuits or for the optical integrated circuits.

DETAILED DESCRIPTION OF THE PRESENTLY PREFERRED EMBODIMENTS

Now, embodiments of the present invention will be described with reference to the drawings.

Embodiment 1

Figure 1:
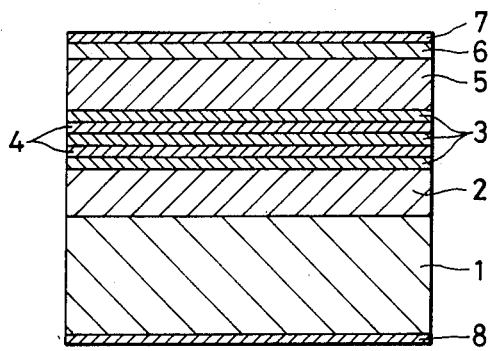
FIG. 1 is a sectional view showing an embodiment of a semiconductor laser according to the present invention.
Figure 2:
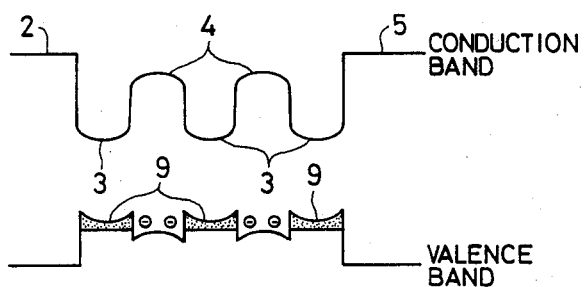
FIG. 2 is a diagram showing the energy bands of a quantum well structure.
Figure 3:
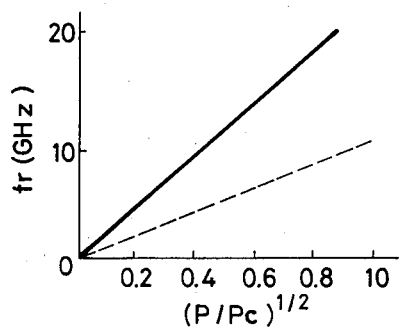
FIG. 3 is a graph showing the experimental results of relaxation oscillation frequencies $f_r$.

FIG. 1 is a sectional view showing Embodiment 1 of a semiconductor laser according to the present invention, FIG. 2 is an energy band diagram of a quantum well structure, and FIG. 3 is a graph showing the experimental results of relaxation oscillation frequencies $f_r$. Referring to FIG. 1, an n-type $Ga_{1-x}Al_xAs$ cladding layer (x=0.45) 2 was grown on an n-type GaAs substrate 1 by the metal-organic chemical vapor deposition, and a multiple quantum well structure was grown thereon. The multiple quantum well structure layer was such that p-type $Ga_{1-y}Al_yAs$ active layers (y=0–0.2, thickness: 3–15 nm) 3 and undoped $Ga_{1-z}Al_zAs$ barrier layers (z>y, thickness: 3–20 nm) 4 were alternately grown into 2–10 layers. Subsequently, a p-type $Ga_{1-x}Al_xAs$ layer 5 and a p-type GaAs layer 6 were grown, and a p-side electrode of Cr-Au 7 and an n-side electrode of Au-GeNi-Au 8 were evaporated. Then, the resultant structure was cut to individual chips. Here, when the active layers 3 were doped with a p-type impurity of at least $1 \times 10^{18}$ cm$^{-3}$, the differential gain enlarged, and the maximum frequency rose from 10 GHz in the prior art to 20 GHz. When the concentration of the doping impurity exceeds $1 \times 10^{19}$ cm$^{-3}$, lattice defects increase, and hence, the impurity concentration should preferably be restrained to the order of $1 \times 10^{18}$ cm$^{-3}$. In addition, when the active layers are doped with Zn, disordering attributed to diffusion arises, and the quantum well structure can vanish. It is therefore desirable to employ Mg, Be etc., which are more effective.

Embodiment 2

Another embodiment of the present invention will be described by referring to FIG. 1 similarly. An n-type $Ga_{1-x}Al_xAs$ cladding layer 2 was grown on an n-type GaAs substrate 1 by the metal-organic chemical vapor deposition. In the present embodiment, a multiple quantum well structure formed on the cladding layer 2 was such that undoped $Ga_{1-y}Al_yAs$ active layers (y=0–0.2, thickness: 3–15 nm) 3 and p-type $Ga_{1-z}Al_zAs$ barrier layers (z>y, thickness: 3–20 nm) 4 were alternately grown into 2–10 layers. Here, when the barrier layers 4 were doped with a p-type impurity of at least $1 \times 10^{18}$ cm$^{-3}$, most of the created holes were trapped by the active layers 3. An energy band diagram in this case is shown in FIG. 2. High densities of holes 9 exist in the active layers 3 as illustrated in the figure, and as in the foregoing embodiment, the differential gain enlarges to raise the maximum frequency. The experimental results of relaxation oscillation frequencies in the case where the barrier layers 4 were doped with $3 \times 10^{18}$ cm$^{-3}$ of Mg. are shown in FIG. 3. In this figure, the axis of abscissas represents the square root of the optical power P normalized by the catastrophic degradation optical power $P_c$, while the axis of ordinates represents the relaxation oscillation frequency $f_r$. As compared with the data of the quantum well type laser in the prior art indicated by a broken line, the maximum frequency was enhanced above 20 GHz in the present embodiment as indicated by a solid line.

Since, in the present embodiment, the active layer 3 is not directly doped with an impurity, a band tail attributed to impurity doping is not formed, and the two-dimensionality of electrons or holes is not deteriorated in the quantum well structure. Therefore, the differential gain based on the quantum well structure does not lower, and the increase of the speed of direct modulation is ensured more. As the p-type impurity, any of Mg, Be etc. is effective as in the preceding embodiment. Moreover, in case of this embodiment, not only the p-type impurity but also an n-type impurity such as Si, Te or Se is effective. Further, when in the respective embodiments, the barrier layer is made of InP and the active layer is made of InGaAsP and they are doped with similar impurities, similar effects can be attained in both the cases. Besides, although in both the embodiments was performed selective doping, both the active layer and the barrier layer may well be doped uniformly.

Figure 4:
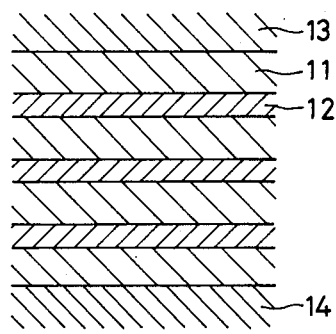
FIGS. 4–6 are sectional views of multiple quantum well structures illustrative of the present invention.
Figure 5:
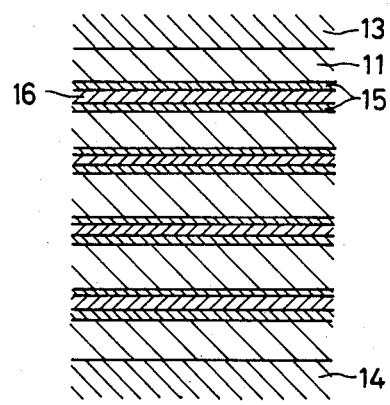
Figure 6:
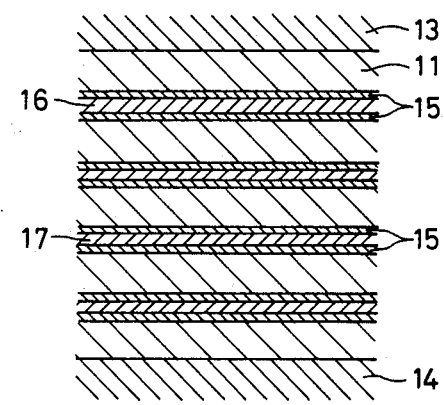

FIGS. 4–6 are sectional views of multiple quantum well structures illustrative of the present invention.

In particular, FIG. 4 shows a device wherein the active layer where the carriers exist is not doped but only a barrier layer is selectively doped, the two-dimensionality of the carriers is not deteriorated, and the high-speed modulation characteristics can be improved.

FIG. 5 shows a structure in which, in the barrier layer, several atomic layers lying in contact with the active layer are left undoped, while the central region of the barrier layer is of the p-type or n-type.

FIG. 6 shows a device wherein the central regions of the barrier layers are selectively doped, so that they are put into the n-type on the side of a p-type cladding layer and into the p-type on the side of n-type cladding layer.

Embodiment 3

Figure 7A:
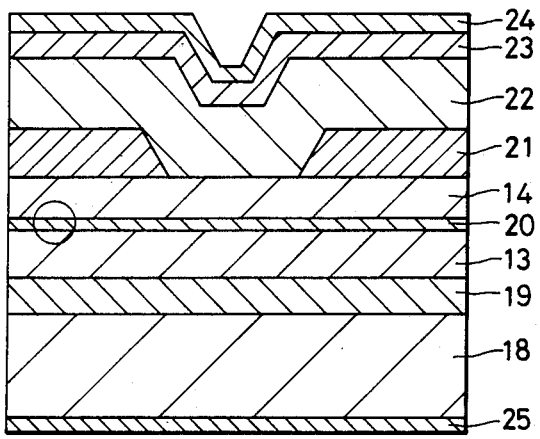
FIGS. 7a and 7b, 8a and 8b, 9a and 9b, and 10a and 10b are sectional views of semiconductor lasers showing embodiments of the present invention.
Figure 7B:
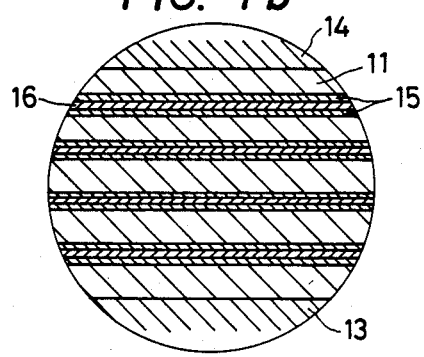

Reference will be had to FIGS. 7a and 7b, FIG. 7b shows, in greater detail, the circled portion including the multiple quantum well active layer 20 shown in FIG. 7a.

Using the MOCVD (metal-organic chemical vapor deposition), there were successively formed on an n-type GaAs substrate crystal 18 an n-type GaAs buffer layer 19, an n-type $Ga_{1-x}Al_xAs$ cladding layer 13 (x=0.45), a multiple quantum well active region 20 in which five undoped GaAs active layers 11 having a thickness of 70 Å were formed alternately with four barrier layers each being so formed that a p-$Ga_{0.7}Al_{0.3}As$ layer 16 doped with $2 \times 10^{18}$ (cm$^{-3}$) of Mg and having a thickness of 20 Å was sandwiched between undoped $Ga_{0.7}Al_{0.3}As$ layers 15 having a thickness of 10 Å, a p-type $Ga_{1-x}Al_xAs$ cladding layer 14, and an n-type GaAs light absorption layer 21. The middle part of the n-type GaAs layer 21 was completely removed by photoetching, to form a groove stripe 1–15 μm wide exposing the surface of the p-type $Ga_{1-x}Al_xAs$ cladding layer 14. Subsequently, a p-type $Ga_{1-x}Al_xAs$ cladding layer 22 (x=0.45) and a p-type GaAs capping layer 23 were formed by the MOCVD. A p-side electrode 24 and an n-side electrode 25 were thereafter formed, whereupon a laser having a resonator length of about 300 μm was obtained by cleavage. Herein, when the thickness of the p-type $Ga_{0.55}Al_{0.45}As$ layer 14 is 0.1–0.5 μm, the waveguide structure becomes the index-guide structure, and the transverse mode during high-speed modulation can be stabilized.

The device manufactured for trial oscillated continuously at room temperature with a threshold current of 10–25 mA at a wavelength of 830 nm, the lasing spectrum exhibited a single longitudinal mode, and a stable transverse mode oscillation having no kink up to an optical power of 70 mW was attained. When the laser was biased to an optical power of 60 mW and subjected to small signal direct modulation, a favorable characteristic reaching 15 GHz (3 dB down) was attained as the modulation frequency. As a lifetime in a fixed optical power operation of an optical power of 60 mW at 70° C., any conspicuous deterioration was not noted even after lapse of 2000 hours, and a high reliability was verified. Further, as multiple quantum well structures other than mentioned above, substantially the same high-speed modulation characteristics were attained in all the combinations of $Ga_{1-W}Al_WAs$ well layers in which the mol ratio W of Al was 0–0.2, each of which had a thickness of 30–150 Å and the number of which was 2–10, and $Ga_{1-B}Al_BAs$ barrier layers in which the mol ratio B of Al was 0.2–0.5 (subject to B>W) and in each of which a sideward undoped barrier layer was 2.8–30 Å thick while a p-type barrier layer being a center region was 5–50 Å thick.

Embodiment 4

Figure 8A:
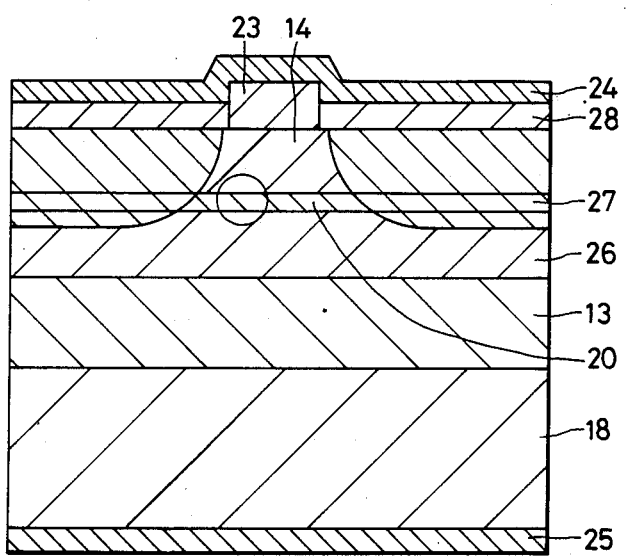
Figure 8B:
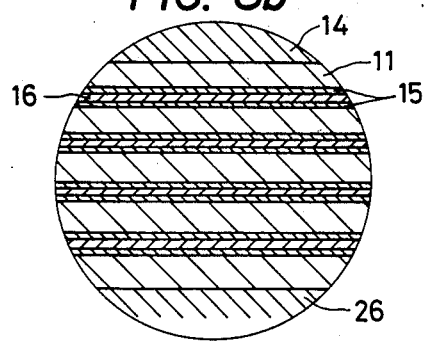

Reference will be had to FIGS. 8a and 8b. FIG. 8b shows, in greater detail, the circled portion including multiple quantum well active layer 20 shown in FIG. 8a.

Using the MOCVD, there were successively formed on an n-type GaAs substrate 18 an n-type GaAlAs cladding layer 13, an n-type GaAlAs light guiding layer 26, the same multiple quantum well active region 20 as in the embodiment of FIGS. 7a and 7b, a p-type GaAlAs cladding layer 14, and a p-type GaAs capping layer 23. The p-type GaAs capping layer was removed by photoetching so as to leave a stripe 1–15 μm wide behind, and Si was ion-implanted into a region outside the p-type GaAs capping layer 23 of the stripe geometry so as to penetrate the active region 20. Thereafter, $SiO_2$ 28 was deposited outside the p-type GaAs capping layer of the stripe geometry, and a p-side electrode 24 and an n-side electrode 25 were formed. Subsequently, a laser having a resonator length of about 300 μm was obtained by cleavage. With the present embodiment, characteristics similar to those of the embodiment of FIGS. 7a and 7b were attained. Further, as regards the active layer structure, the range indicated in the embodiment of FIGS. 7a and 7b was entirely applicable, and similar characteristics were attained.

Embodiment 5

Figure 9A:
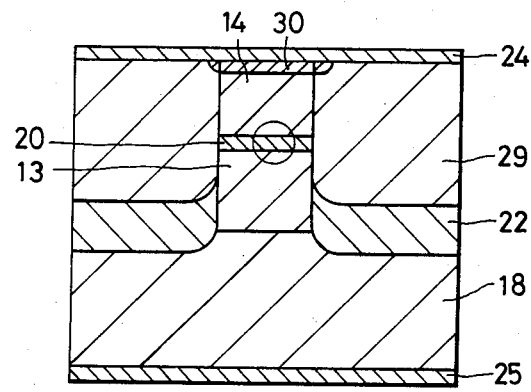
Figure 9B:
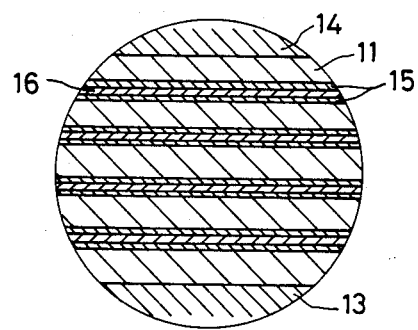

Reference will be had to FIGS. 9a and 9b. FIG. 9b shows, in greater detail, the circled portion including multiple quantum well active layer 20 shown in FIG. 9a.

An n-type GaAlAs cladding layer 13, the same multiple quantum well active region 20 as in the embodiment of FIGS. 7a and 7b, and a p-type GaAlAs cladding layer 14 were grown on an n-type GaAs substrate 18. Subsequently, the resultant structure was photoetched down to the n-type GaAs substrate 18 so as to leave a stripe 1–5 μm wide behind. Thereafter, a p-type GaAlAs layer 22 and an n-type GaAlAs layer 29 were grown, and a Zn-diffused region 30 was provided. Thereafter, a p-side electrode 24 and an n-side electrode 25 were formed, whereupon a laser having a resonator length of about 300 μm was obtained by cleavage. Also the present embodiment exhibited favorable high-speed modulation characteristics. Since the active region was wholly surrounded with the GaAlAs, the lateral diffusion of carriers was not involved, high-speed characteristics were more excellent and modulation up to 20 GHz was possible. Further, as regards the active layer structure, the range indicated in the embodiment of FIGS. 7a and 7b was entirely applicable, and similar characteristics were attained.

Embodiment 6

Figure 10A:
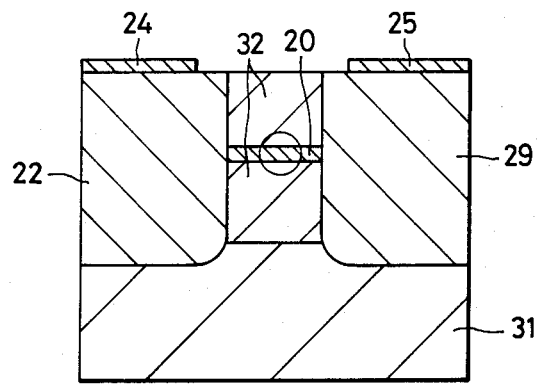
Figure 10B:
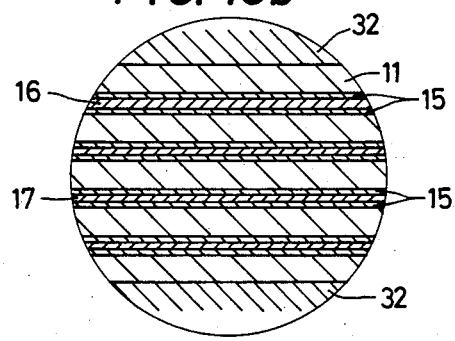

Reference will be had to FIGS. 10a and 10b. FIG. 10b shows, in greater detail, the circled portion including the multiple quantum well active layer 20 shown in FIG. 10a.

On an insulating GaAs substrate 31, there were formed an undoped GaAlAs layer 32, a multiple quantum well active region 20 wherein three undoped GaAs active layers 11 having a thickness of 70 Å were formed alternately with two barrier layers in each of which an n-$Ga_{0.7}Al_{0.3}As$ layer 17 doped with $2 \times 10^{18}$ (cm$^{-3}$) and having a thickness of 20 Å was sandwiched between undoped $Ga_{0.7}Al_{0.3}As$ layers 15 having a thickness of 10

Å and wherein two undoped GaAs active layers having a thickness of 70 Å were formed alternately with two barrier layers in each of which a p-$Ga_{0.7}Al_{0.3}As$ layer 16 doped with $2\times10^{18}$ ($cm^{-3}$) of Mg and having a thickness of 20 Å was sandwiched between undoped $Ga_{0.7}Al_{0.3}As$ layers 15 having a thickness of 10 Å, and another undoped GaAlAs layer 32. Thereafter, the grown layers were etched so as to be left in the geometry of a stripe 1-5 μm wide. A p-type GaAlAs buried layer 22 and an n-type GaAlAs buried layer 29 were formed, followed by the formation of a p-side electrode 24 and an n-side electrode 25. Subsequently, a laser having a resonator length of about 300 μm was fabricated by cleavage. This laser had a structure in which carriers were transversely injected into the active region. Further, since the multiple quantum well active layer had both p- and n-impurities introduced into the barrier layers, the increment of the gain versus the injected carriers enlarged more, and direct modulation up to 20 GHz was permitted. When this multiple quantum well active region which contained both the p- and n-impurities in the barrier layers was applied to the embodiments shown in FIGS. 7a and 7b, 8a and 8b, and 9a and 9b similar high-speed modulation characteristics were attained. Even when Be was applied as the p-type impurity and Si as the n-type impurity in the respective embodiments, similar results were obtained.

Embodiment 7

Figure 11:
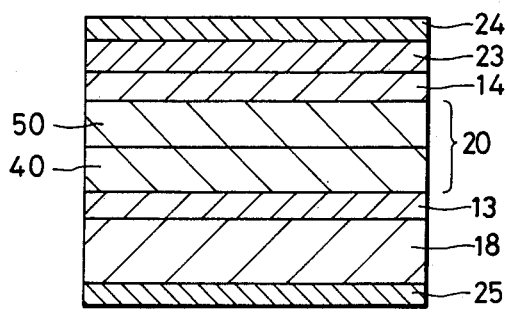
FIG. 11 is a sectional view showing another embodiment of the present invention.

Reference will be had to FIG. 11.

An n-type GaAlAs cladding layer 13 was formed on an n-type GaAs substrate 18. A quantum well active region 20 was formed by growing on the cladding layer 13 a quantum active region 40 in which five p-$Ga_{0.8}Al_{0.2}As$ well layers doped with $1\times10^{17}$ ($cm^{-3}$) of Mg and four p-$Ga_{0.7}Al_{0.3}As$ barrier layers doped with $2\times10^{18}$ ($cm^{-3}$) of Mg were alternately stacked, and then a quantum active region 50 in which four p-$Ga_{0.8}Al_{0.2}As$ active layers doped with $1\times10^{17}$ ($cm^{-3}$) of Se and four p-$Ga_{0.7}Al_{0.3}As$ barrier layers doped with $1\times10^{19}$ ($cm^{-3}$) of Se were alternately stacked. On the resultant structure, a p-type GaAlAs cladding layer 14 and a p-type GaAs capping layer 23 were successively formed by the MOCVD. Thereafter, a stripe geometry was formed in the same way as in Embodiment 4, and electrodes 24 and 25 were formed, to obtain a semiconductor laser. This laser had a modulation speed of 15 GHz.

Embodiment 8

Using the MOCVD, there were successively formed on an n-type GaAs substrate an n-type GaAlAs cladding layer 13, a quantum well active region wherein five undoped GaAlAs active layers having a thickness of 40 Å were stacked alternately with four barrier layers each made up of an undoped $Ga_{0.7}Al_{0.3}As$ film having a thickness of 10 Å, a p-$Ga_{0.7}Al_{0.3}As$ film having a thickness of 30 Å and an undoped $Ga_{0.7}Al_{0.3}As$ film having a thickness of 10 Å which were successively stacked and wherein a barrier layer which consisted of an undoped $Ga_{0.7}Al_{0.3}As$ film having a thickness of 10 Å and a p-$Ga_{0.7}Al_{0.3}As$ film having a thickness of 20 Å, and an undoped GaAlAs active layer were further stacked thereon, and a p-type GaAlAs cladding layer. The other points were the same as in Embodiment 4. The characteristics of a semiconductor laser thus fabricated were similar to those of Embodiment 3.

Embodiment 9:

After an n-type cladding layer was formed on a GaAs substrate, a quantum well active region was formed thereon wherein five undoped active layers were stacked alternately with four barrier layers in each of which a one-atom layer (that is, a layer one atom in thickness) lying in contact with the well layer was undoped whereas the other part was rendered the p-type. A p-type cladding layer was formed on the active layer. The other points were the same as in Embodiment 4. The modulation speed of a semiconductor laser thus obtained was 13 GHz.

Figure 12:
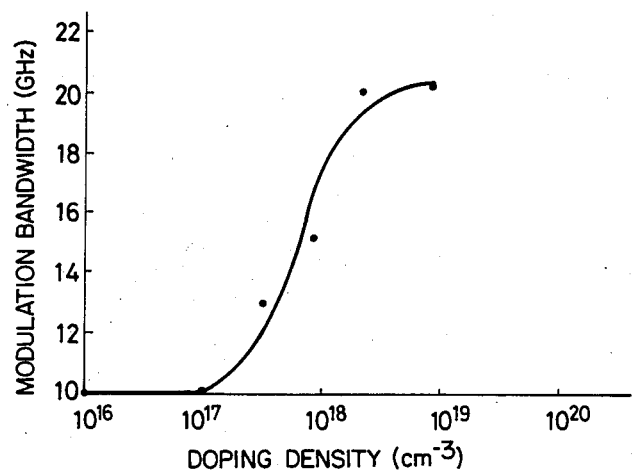
FIG. 12 is a graph for explaining an effect of the present invention.
Figure 13:
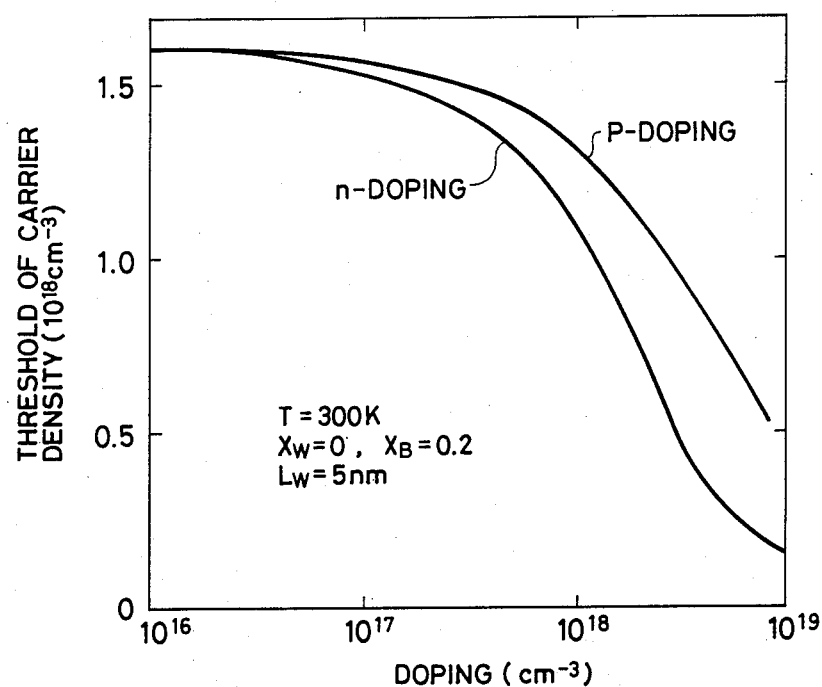
FIG. 13 is a diagram illustrating the principle of the present invention based upon calculated values of the threshold of carrier density with respect to the doping density.

As to the semiconductor laser of the foregoing embodiments, samples were fabricated by varying the quantity of doping. Then, the effect of the present invention was remarkably demonstrated from a doping quantity of $5\times10^{17}$ ($cm^{-3}$) (refer to FIG. 12). However, when the quantity of doping reached $2\times10^{19}$ ($cm^{-3}$), crystal lattices increased and no semiconductor laser was obtained.

Embodiment 10

Figure 14A:
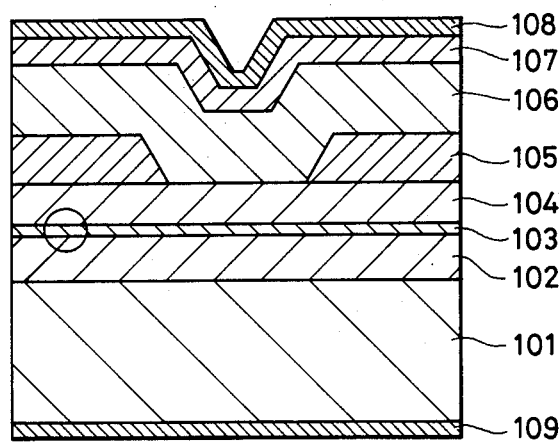
FIGS. 14a and 14b, 15a and 15b, and 16 are sectional views of elements according to embodiments of the present invention.

An embodiment of the present invention will now be described in conjunction with the drawings. FIG. 14a is a sectional view illustrating a semiconductor laser device according to an embodiment of the present invention; and FIG. 14b, illustrates, on an enlarged scale, a portion thereof including multiple quantum well active layer 103 shown in FIG. 14a.

Figure 14B:
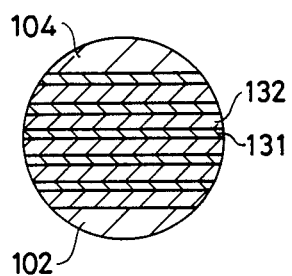

FIGS. 14a and 14b on an n-type GaAs substrate crystal 101 were successively formed an n-type $Ga_{1-x}Al_xAs$ cladding layer 102 (x=0.45), a multiple quantum well active region 103 consisting of five n-type doped GaAs active layers 131 having a thickness of 8 nm and doped with selenium ions at a density of $4\times10^{18}$ $cm^{-3}$ and five undoped or n-type doped $Ga_{0.8}Al_{0.2}As$ barrier layers 132 having a thickness of 3 nm and doped with selenium ions, that were alternatingly stacked, a p-type $Ga_{1-x}Al_xAs$ cladding layer (x=0.45) 104, and an n-type GaAs current confining layer 105, by the MOCVD method. A groove stripe having a width of 1 to 15 μm was formed by photoetching to completely remove the n-type GaAs layer 105 and to expose the surface of the p-type $Ga_{1-x}Al_xAs$ cladding layer 104. Next, the p-type $Ga_{1-x}Al_xAs$ cladding layer (x=0.45) 106 and a p-type GaAs cap layer 107 were formed by the MOCVD method. Thereafter, a p-side electrode 108 and an n-side electrode 109 were formed, and a semiconductor laser device having a resonator length of about 300 μm was obtained by the cleavage method. To stably maintain the transverse mode of laser beam through an optical guide of the index-guided structure, the p-type cladding layer 104 must have a thickness $d_4$ that lies within a range of $0.1 < d_4 < 0.7$ μm.

In the above embodiment, the device oscillated continuously at room temperature at an oscillation wavelength of 830 nm on a threshold current of 1 to 2 mA, exhibiting the oscillation spectrum of a longitudinal single mode. It was confirmed that the transverse mode remained stable up to an optical output of 20 mW. When placed in operation to produce a constant optical output of 20 mW at a temperature of 90° C., the life was not conspicuously degraded even after the time of 5000 hours has passed, verifying the fact that the device was highly reliable. This is due to the fact that the current density is decreased conspicuously by the multiple quantum well that is n-type doped highly densely.

Embodiment 11

Figure 15A:
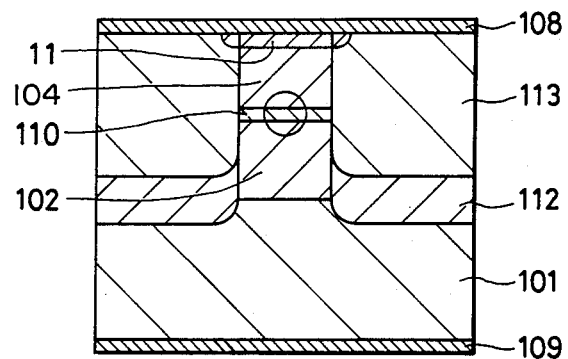
Figure 15B:
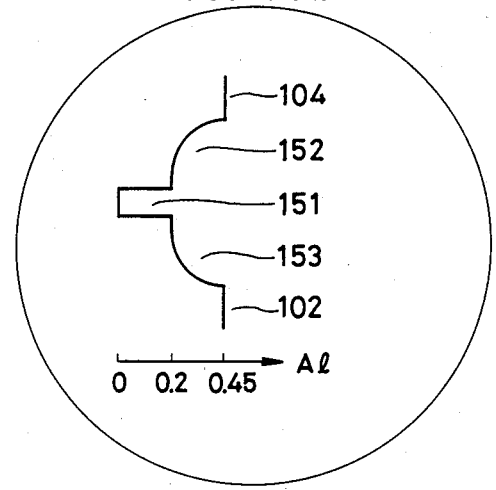

Another embodiment of the invention will be described in conjunction with FIGS. 15a and 15b. FIG. 15b shows the aluminum mole ratio of the layers including GRIN-SCH active layer 20 shown circled in FIG. 15a.

On an n-type GaAs substrate 101 were formed an n-type GaAlAs cladding layer 102, a GRIN-SCH active layer 110 consisting of an n-GaAlAs barrier layer 153 which is 0.1 µm thick and in which the aluminum mole ratio gradually changes from 0.45 to 0.2, a GaAs well layer 151 which is 6 nm thick and which is doped with magnesium at a density of $6 \times 10^{18}$ cm$^{-3}$, and a p-GaAlAs barrier layer 152 which is 0.1 µm thick and in which the aluminum mole ratio gradually changes from 0.2 to 0.45, followed by the formation of a p-type GaAlAs cladding layer 104 that was grown thereon. Thereafter, the photoetching was effected in the form of a stripe maintaining a width of 1 to 5 µm to reach the n-type GaAs substrate 101. Thereafter, a p-type GaAlAs layer 112 and an n-type GaAlAs layer 113 were grown, and a zinc-diffused region 111 was formed. Then, a p-electrode 108 and an n-electrode 109 were formed, and a laser element having a resonator length of about 300 µm was obtained by the cleavage method.

In this embodiment, the semiconductor laser has a structure of the BH (buried heterostructure) type, and there exists no reactive current that does not contribute to the oscillation. Therefore, the threshold current can be further decreased, and the device continuously oscillates at room temperature on the threshold current of from 0.5 to 1.5 mA, exhibiting a single longitudinal mode at a wavelength of 800 nm. When placed in operation to constantly produce an optical output of 10 mW at a temperature of 100° C., furthermore, the life was not conspicuously deteriorated even after a time of 6000 hours has passed, verifying improved reliability of the element.

Embodiment 12

Figure 16:
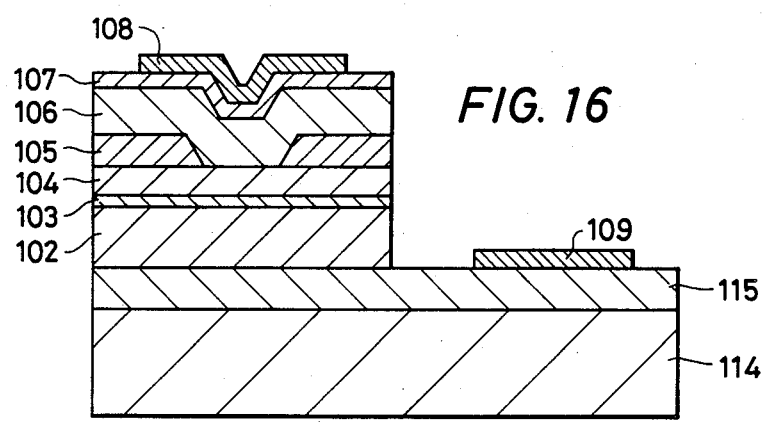

A further embodiment according to the present invention will be described in conjunction with FIG. 16. On a semi-insulated GaAs substrate 114 was grown an n+-type GaAs layer 115 by the MOCVD method, and then semiconductor layers were formed thereon in the same manner as in the embodiment 1. Then, the etching was effected so that the surface of the n+-type GaAs layer 115 was partly exposed, and a p-electrode 108 and an n-electrode 109 were formed. A laser element having a resonator length of about 300 µm was obtained by the cleavage method. This embodiment also exhibited characteristics that were nearly the same as those of the embodiments 10 and 11. In this embodiment, furthermore, a semiconductor laser of an ultra-low threshold current was formed on the semi-insulating substrate, and it is expected that the device can be adapted to OEIC's.

Though magnesium and selenium ions were used as impurities in the above-mentioned embodiments, nearly the same effects are obtained even when silicon and beryllium ions are used. Moreover, nearly the same effects are obtained even when the well layer having a width of from 3 to 10 nm, p-type impurities of a density of (4 to 10)$\times 10^{18}$ cm$^{-3}$, and n-type impurities of a density of (2 to 10) $\times 10^{18}$ cm$^{-3}$ are combined together. In the above-mentioned embodiments, furthermore, though the impurity doping of either the p-type or the n-type was effected, it is allowable to perform the doping of both types.

According to the present invention, the same results could be obtained with the GaAlAs-type semiconductor laser devices having wavelengths of from 0.68 to 0.89 µm over a whole range in which they could oscillate continuously at room temperature, in addition to the devices having wavelengths of near 0.80 µm. According to the present invention, the semiconductor laser device can be realized using laser materials other than those of the GaAlAs-type, such as using materials of, for example, the InGaAsP-type and the InGaP-type. Further, the laser structure need not be limited to the three-layer waveguide structure dealt with in the aforementioned embodiments, but may be of the LOC (large optical confinement) structure in which an optical guide layer is provided adjacent to one side of the active layer or the SCH (separate confinement hetero) structure in which optical guide layers are provided adjacent to both sides of the active layer.

In the above-mentioned embodiments, furthermore, the same effects are obtained even with the structure in which the conductivity types are all reversed (p-type is replaced by n-type, and n-type is replaced by p-type).

What is claimed is:

1. A semiconductor laser comprising:
   a semiconductor substrate;
   a plurality of semiconductor layers formed on the substrate, the plurality of semiconductor layers including a cladding layer, at least one active layer and at least one barrier layer, the at least one active layer and at least one barrier layer being stacked alternately so as to form a multiple quantum well structure and together forming an active region, and a resonant cavity including said active region, wherein the at least one active layer respectively has a thickness that is smaller than a wave packet of free electrons within a crystal, and wherein the active region has a light emitting portion in which there is a part doped with impurities, the impurity concentration thereof being larger than $10^{18}$cm$^{-3}$; and
   a pair of electrodes for injecting carriers into the light emitting portion, to emit light.

2. A semiconductor laser according to claim 1, wherein the impurity density of said at least one barrier layer is made higher than that of said at least one active layer.

3. A semiconductor laser according to claim 1, wherein said at least one active layer is undoped, and said at least one barrier layer has an n- or p-conductivity type.

4. A semiconductor laser according to claim 1, wherein said at least one active layer is undoped, and a part of the at least one barrier layer has an n- or p-conductivity type.

5. A semiconductor layer according to claim 1, wherein the impurities are p-type impurities.

6. A semiconductor laser according to claim 16, wherein the impurities are n-type impurities.

7. A semiconductor laser according to claim 1, wherein the impurities are of both p-type and n-type, with the p-type and n-type impurities respectively being doped in different sub-regions of said part.

8. A semiconductor laser according to claim 5, wherein the impurity concentration is greater than $4 \times 10^{18}$ cm$^{-3}$.

9. A semiconductor laser according to claim 6, wherein the impurity concentration is greater than $2\times10^{18}$ cm$^{-3}$.

10. A semiconductor laser according to claim 1, wherein the impurity concentration is at most $10^{19}$ cm$^{-3}$.

11. A semiconductor laser according to claim 1, wherein the impurities are selected from the group consisting of Mg, Be, Si and Se.

12. A semiconductor laser according to claim 1, wherein the part doped with impurities is the at least one barrier layer.

13. A semiconductor laser according to claim 12, wherein each of the at least one barrier layers has a central portion and outer sandwiching portions, the central portion being doped with impurities and the outer sandwiching portions being undoped.

14. A semiconductor laser according to claim 1, wherein the part doped with impurities is the at least one active layer.

15. A semiconductor laser according to claim 1, wherein the plurality of semiconductor layers include a pair of cladding layers, with the pair of cladding layers on the sides of the active region so as to sandwich the active region therebetween, and further include a current confining layer on one of the cladding layers, on a side thereof not adjacent the active region.

16. A semiconductor laser according to claim 15, wherein the plurality of semiconductor layers further includes a further cladding layer on the current confining layer, with the current confining layer having a groove stripe therethrough, and the further cladding layer extending through the groove stripe to contact the cladding layer on which the current confining layer is positioned.

17. A semiconductor laser according to claim 16, wherein the cladding layer, on which the current confining layer is positioned, has a thickness of 0.1 to 0.7 μm.

18. A semiconductor laser according to claim 1, wherein the substrate is a semi-insulating semiconductor substrate, and wherein the plurality of semiconductor layers includes a first semiconductor layer doped with a high impurity concentration of a first conductivity type, with the cladding layer and active region being formed on said first semiconductor layer.

19. A semiconductor laser according to claim 18, wherein the plurality of semiconductor layers include a pair of cladding layers, sandwiching the active region, and a current confinement layer on the cladding layer on the active region.

20. A semiconductor laser comprising:
a semiconductor substrate;
a plurality of semiconductor layers forming a cladding layer and a multiple quantum well active region, the multiple quantum well active region providing a resonant cavity, the multiple quantum well active region being formed by at least one active layer and at least one barrier layer stacked alternately on each other, wherein the multiple quantum well active region has a light emitting portion in which there is a part doped with impurities, the impurity concentration thereof being larger than $10^{18}$ cm$^{-3}$; and
a pair of electrodes for injecting carriers into the light emitting portion, to emit light.

21. A semiconductor laser comprising:
a semiconductor substrate;
a plurality of semiconductor layers formed on the substrate, the plurality of semiconductor layers including a multiple quantum well active region formed of at least one active layer and at least one barrier layer stacked alternately, and also including first conductivity type and second conductivity type cladding layers respectively sandwiching the multiple quantum well active region, the first and second conductivity types being opposite conductivity types to each other, the at least one active layer each having a thickness less than the de Broglie wavelength of electrons, the at least one barrier layer having a bandgap greater than that of the at least one active layer, the cladding layers having a bandgap larger than that of the at least one active layer, wherein the multiple quantum well active region has a light emitting portion in which there is a part doped with impurities, the impurity concentration thereof being greater than $10^{18}$ cm$^{-3}$, and wherein the laser includes a resonant cavity including said multiple quantum well active region; and
a pair of electrodes for injecting carriers into the light emitting portion, to emit light.

22. A semiconductor laser according to claim 21, wherein the first conductivity type cladding layer is a p-type cladding layer and the second conductivity type cladding layer is an n-type cladding layer.

23. A semiconductor laser according to claim 22, wherein in said multiple quantum well active region, at least one set of active and barrier layers which are continuous in adjacency to said p-type cladding layer have the n-conductivity type, and the other region of said multiple quantum well active region has the p-conductivity type.

24. A semiconductor laser according to claim 22, wherein in said multiple quantum well active region, at least one barrier layer, which is continuous and adjacent to said p-type cladding layer, has the n-conductivity type, the barrier layers in the other region of said multiple quantum well active region have the p-conductivity type, and all of said active layers are undoped.

25. A semiconductor laser according to claim 22, wherein in said multiple quantum well active region, at least one barrier layer, which is continuous and adjacent to said p-type cladding layer, has the n-conductivity type, but at least one atom layer from an interface at which it lies in contact with an active layer is undoped; the barrier layers in the other region of said multiple quantum well active region have the p-conductivity type, but at least one atom layer from an interface at which it lies in contact with an active layer is undoped; and all of said active layers are undoped.

26. A semiconductor laser according to claim 21, wherein said barrier layer is undoped in at least one atom layer from an interface at which it lies in contact with said active layer and has the p-conductivity type in the other region, and said active layer is undoped.

27. A semicondcutor laser according to claim 21, wherein each active layer has a thickness of from 3 nm to 10 nm.

28. A semiconductor laser comprising:
a semiconductor substrate;
a plurality of semiconductor layers formed on said semiconductor substrate, the plurality of semiconductor layers including an active region and cladding layers sandwiching the active region, wherein the active region is a multiple quantum well structure including at least one active layer and at least one barrier layer alternately stacked one upon another, each of the active layers having a thickness smaller than the de Broglie wavelength, and each of the barrier layers having a forbidden band width greater than that of the active layers, the active region including a light emitting portion in which there is a part doped with impurities, the impurity concentration thereof being greater than $10^{18} cm^{-3}$, so as to decrease the threshold current for driving the semiconductor laser, the laser including a resonant cavity including said active region; and a pair of electrodes for injecting carriers into the light emitting portion, to emit light.

29. A semiconductor laser according to claim 28, wherein the active region is a graded-index-separate-confinement-heterostructure.

30. A semiconductor laser according to claim 29, wherein the active region includes an active layer sandwiched by barrier layers, the active region being sandwiched by cladding layers, the cladding layers and active region being in the form of a stripe on the substrate, and wherein the plurality of semiconductor layers further includes two layers, of opposite conductivity type to each other, formed stacked one on the other on the semiconductor substrate, at the sides of the stipe.

31. A semiconductor laser according to claim 30, further comprising a zinc-diffused region formed at the top of the stripe, in the upper one of the two cladding layers.

32. A semiconductor laser according to claim 28, wherein at least one of said at least one barrier layer and said at least one active layer includes said part doped with impurities.

33. A semiconductor laser according to claim 32, wherein said part doped with impurities is doped with n-type impurities, the n-type impurities in the part having an impurity concentration of greater than $2 \times 10^{18}$ $cm^{-3}$.

34. A semiconductor laser according to claim 32, wherein said part doped with impurities is doped with p-type impurities, the p-type impurities in the part having an impurity concentration of greater than $4 \times 10^{18}$ $cm^{-3}$.

35. A semiconductor laser according to claim 34, wherein said p-type impurities consist of at least one selected from the group consisting of magnesium ions and beryllium ions.

36. A semiconductor laser according to claim 32, wherein said part doped with impurities is doped with both p-type and n-type impurities, the p-type impurities in said part having an impurity concentration of greater than $4 \times 10^{18} cm^{-3}$, the n-type impurities in said part having an impurity concentration of greater than $2 \times 10^{18} cm^{-3}$.

37. A semiconductor laser according to claim 36, wherein said n-type impurities consist of at least one selected from the group consisting of selenium ions and silicon ions.

38. A semiconductor laser according to claim 28, wherein the impurity concentration of said part is at most $10^{19} cm^{-3}$.

39. A semiconductor laser according to claim 28, wherein said part doped with impurities is doped with p-type impurities, the p-type impurities in the part having an impurity concentration of greater than $4 \times 10^{18}$ $cm^{-3}$.

40. A semiconductor laser according to claim 28, wherein said part doped with impurities is doped with n-type impurities, the n-type impurities in the part having an impurity concentration of greater than $2 \times 10^{18}$ $cm^{-3}$.

* * * * *